United States Patent
Wentzloff et al.

(10) Patent No.: US 10,911,078 B1
(45) Date of Patent: Feb. 2, 2021

(54) MILLIMETER-SCALE BLUETOOTH LOW ENERGY TRANSMITTER WITH DUAL PURPOSE LOOP ANTENNA

(71) Applicant: THE REGENTS OF THE UNIVERSITY OF MICHIGAN, Ann Arbor, MI (US)

(72) Inventors: David D. Wentzloff, Ann Arbor, MI (US); Yao Shi, Sunnyvale, CA (US); David T. Blaauw, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/791,546

(22) Filed: Feb. 14, 2020

(51) Int. Cl.
| | | |
|---|---|---|
| H04B 1/04 | (2006.01) | |
| H01Q 7/00 | (2006.01) | |
| H03B 5/08 | (2006.01) | |
| H03L 7/099 | (2006.01) | |

(52) U.S. Cl.
CPC ............... *H04B 1/04* (2013.01); *H01Q 7/00* (2013.01); *H03B 5/08* (2013.01); *H03L 7/0992* (2013.01); *H03B 2200/004* (2013.01); *H03L 2207/50* (2013.01)

(58) Field of Classification Search
CPC . H04B 1/04; H04B 1/034; H04B 1/40; H03B 5/00; H03B 5/124; H03B 5/08; H03B 5/1212
See application file for complete search history.

(56) References Cited

U.S. PATENT DOCUMENTS

| | | | |
|---|---|---|---|
| 7,372,336 B2 | 5/2008 | Lee et al. | |
| 8,412,290 B2* | 4/2013 | Shamim | G01T 1/026 455/575.7 |
| 9,331,878 B2* | 5/2016 | Cheng | H04L 27/156 |
| 9,455,758 B1* | 9/2016 | Roberts | H04W 24/08 |
| 9,685,910 B2 | 6/2017 | Babaie et al. | |
| 10,270,486 B2 | 4/2019 | Kuo et al. | |
| 2009/0257529 A1* | 10/2009 | Popplewell | H04B 1/26 375/320 |
| 2010/0099367 A1* | 4/2010 | Shamim | G01T 1/026 455/95 |
| 2018/0227002 A1* | 8/2018 | Blaauw | H03B 5/1228 |

* cited by examiner

*Primary Examiner* — Blane J Jackson
(74) *Attorney, Agent, or Firm* — Harness, Dickey & Pierce, P.L.C.

(57) ABSTRACT

A millimeter-scale Bluetooth low energy wireless transmitter is presented with a dual purpose loop antenna. The oscillator employs a high quality factor resonator formed by a printed 3.5×3.5 $mm^2$ inductive loop antenna (simulated Q~110) and an on-chip digitally-switched capacitor array (simulated Q~283). The oscillator replaces the traditional voltage controlled oscillator plus power amplifier, achieving lower power consumption while maintaining phase noise of −118.5 dBc/Hz at 1 MHz offset that results in low FSK modulation error (2.1%) and low frequency drift during BLE packet transmission.

18 Claims, 10 Drawing Sheets

US 10,911,078 B1

MILLIMETER-SCALE BLUETOOTH LOW ENERGY TRANSMITTER WITH DUAL PURPOSE LOOP ANTENNA

FIELD

The present disclosure relates to low energy wireless transmitter with a dual purpose loop antenna.

BACKGROUND

Wireless communication has been a limiting factor for achieving millimeter-sized wireless sensor nodes because of the high power consumption, large antenna size and off-chip components typically required. Several mm-scale radios have been proposed; however, all use proprietary communication protocols, which afford their designers more flexibility to address the above challenges. For interoperability and ubiquitous adoption, it is important that mm-scale radios use standard protocols, such as Bluetooth Low Energy (BLE). However, implementing a BLE-compliant radio in a mm-scale form factor poses significant additional challenges. These include the requirements for center frequency deviation (<150 kHz), FSK modulation accuracy and frequency drift during the packet (<50 KHz), which drive up the power consumption of typical PLL+VCO+PA BLE transmitters to >3 mW. A 0.5 mW BLE transmitter was achieved by relaxing these requirements, but suffered from high phase noise due to its low-power ring oscillator.

Therefore, it is desirable to develop a mm-scale wireless transmitter and antenna that uses standard protocols and consumes on the order of 606 µW.

This section provides background information related to the present disclosure which is not necessarily prior art.

SUMMARY

This section provides a general summary of the disclosure, and is not a comprehensive disclosure of its full scope or all of its features.

A low energy transmitter is presented with a dual purpose loop antenna. The transmitter includes: a loop antenna, an oscillator, a phase-locked loop circuit and a modulator. The loop antenna is configured to radiate at a target frequency. The oscillator generates a carrier signal and supplies the carrier signal to the loop antenna, where the oscillator includes an LC circuit. Of note, the loop antenna acts as an inductor in the LC circuit. The phase-locked loop circuit is interfaced with the oscillator. The modulator is configured to receive a data packet and operates to modulate at least one of amplitude or frequency of the carrier signal in accordance with the data packet. The active components of the oscillator, the phase-locked loop circuit and the modulator are integrated onto a single chip.

In one embodiment, the loop antenna is implemented off the single chip and is the primary energy storage element for the oscillator. The loop antenna may be configured to radiate more than three percent of received signal power.

In some embodiments, the oscillator includes a first resonator circuit electrically coupled between a supply voltage and the oscillator, and a second resonator circuit electrically coupled between the oscillator and electrical ground, such that the first resonator circuit is magnetically coupled to the second resonator circuit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
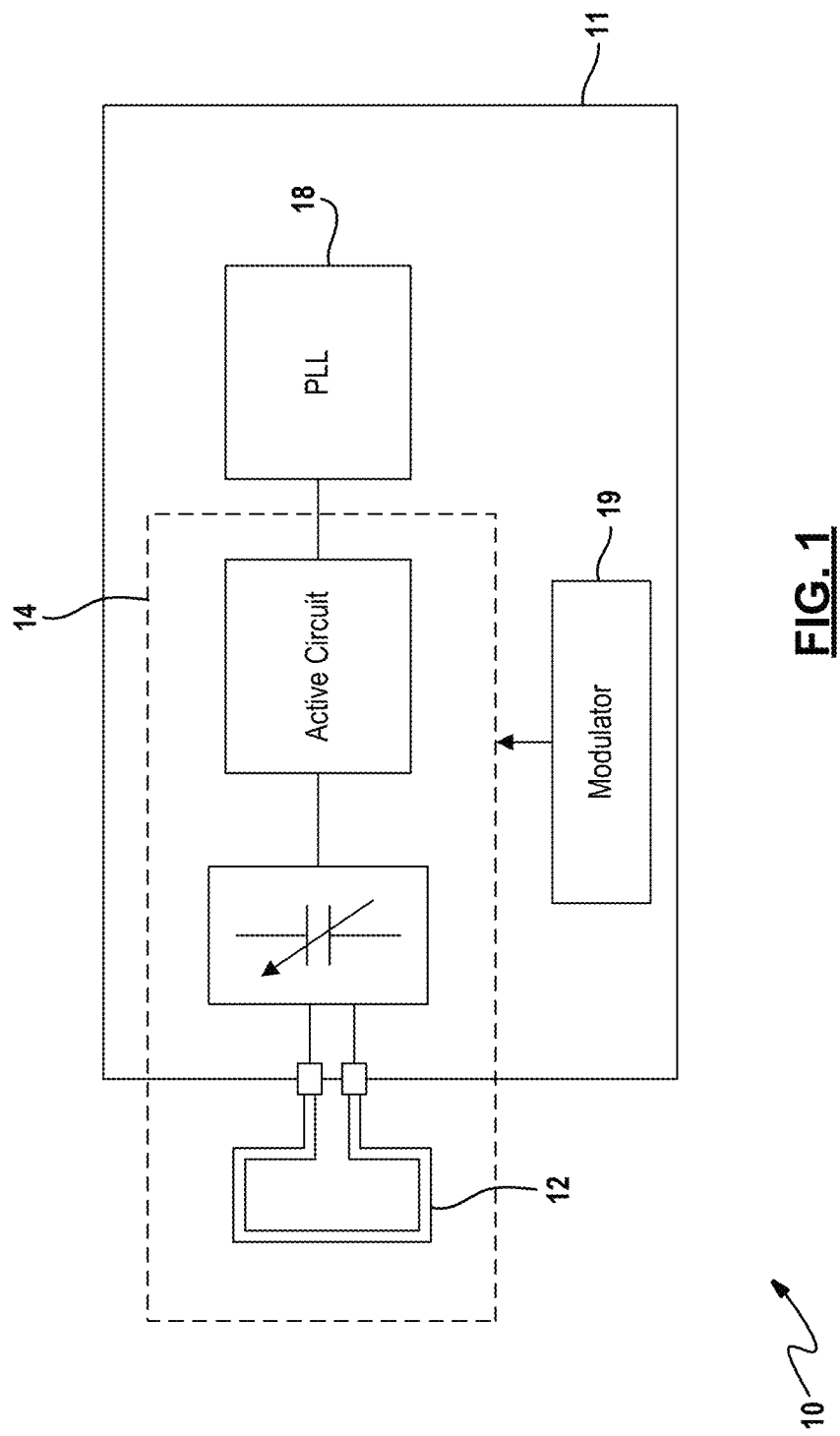
FIG. 1 is a diagram of a low energy wireless transmitter with a dual purpose loop antenna.

FIG. 1 illustrates a low energy wireless transmitter 10 with a dual purpose antenna 12. In addition to the antenna 12, the wireless transmitter 10 is comprised generally of an oscillator 14, a phase-locked loop circuit 18, and a modulator 19. The active components of the oscillator 14, the phase-locked loop circuit 18 and the modulator 19 are preferably integrated onto a single chip 11. It is to be understood that only the relevant components of the transmitter are discussed in relation to FIG. 1, but that other components may be needed to control and manage the overall operation of the transmitter, such as a clock reference and a power source.

The antenna 12 is configured to radiate at a target frequency. In the context of BLE, the target frequency is on the order of 2.4 GHz. In the example embodiment, the antenna 12 is a loop antenna implemented off the chip 11. In some embodiments, the antenna 12 can be integrated on the same chip as the other components of the transmitter 10. The antenna 12 is designed to be the sole antenna of the transmitter and thus is configured to radiate at least three percent of the received signal power. Other types of antennas are also contemplated by this disclosure.

The oscillator 14 generates a carrier signal and supplies the carrier signal to the loop antenna 12. The oscillator 14 includes an LC circuit and an active circuit 17. The LC circuit is comprised of a capacitor array 15 with tunable capacitance and an inductor. Of note, the loop antenna 12 acts as the inductor in the LC circuit of the oscillator 14. That is, the loop antenna is the primary energy storage element for the oscillator, i.e., storing more than half of the total energy stored by the LC circuit. The active circuit 17 compensates for loss in the resonator of the oscillator. The oscillator replaces the conventional voltage controlled oscillator plus power amplifier to achieve lower power consumption as will be further described below.

The phase-locked loop circuit 18 is used to adjust the frequency of the carrier signal generated by the oscillator. The modulator is configured to receive a data packet and modulate at least one of amplitude or frequency of the carrier signal in accordance with the data packet. Different types of modulation schemes are envisioned by this disclosure.

Figure 2:
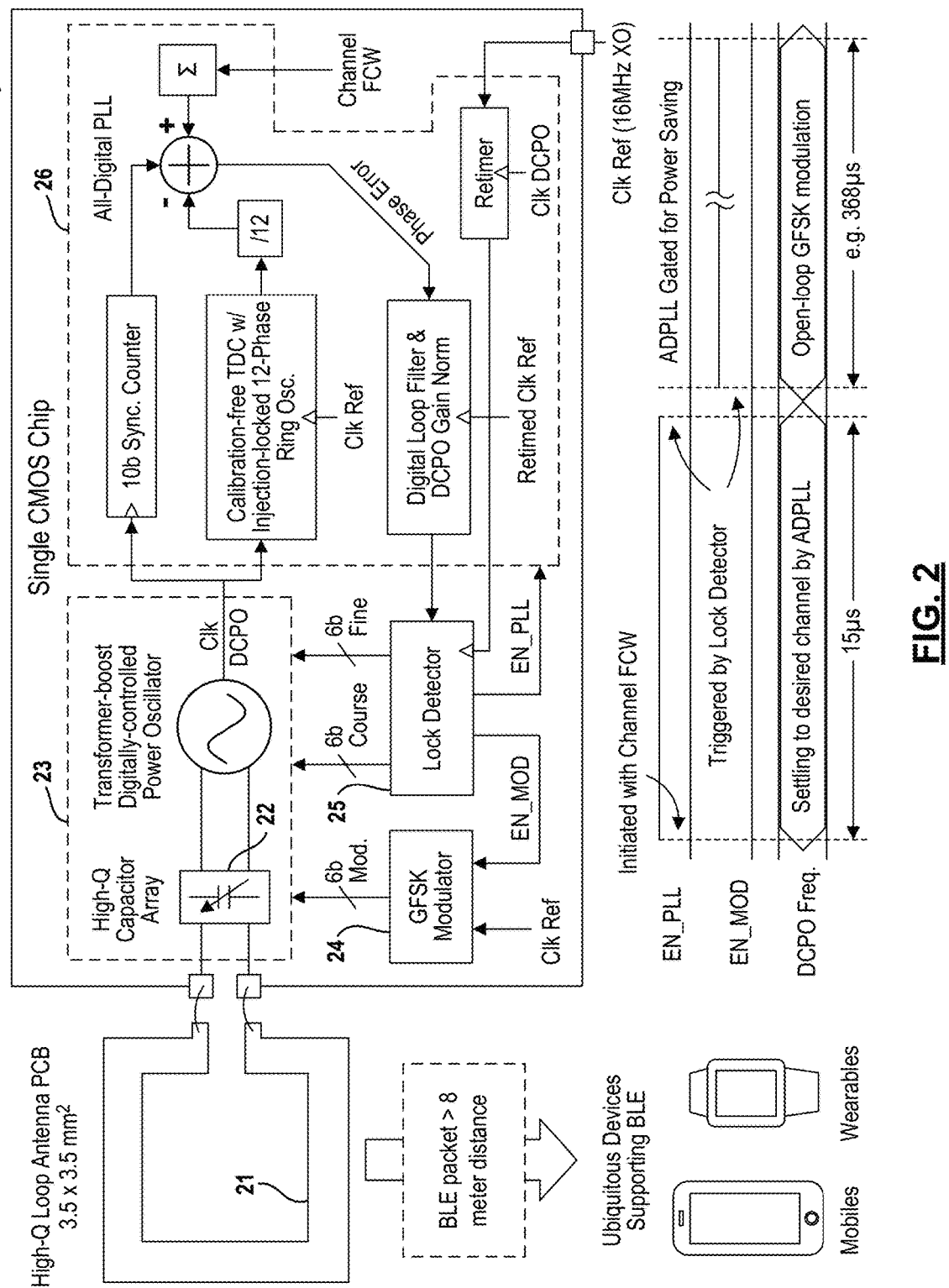
FIG. 2 is block diagram for an example embodiment of the proposed wireless transmitter.
Figure 3A:
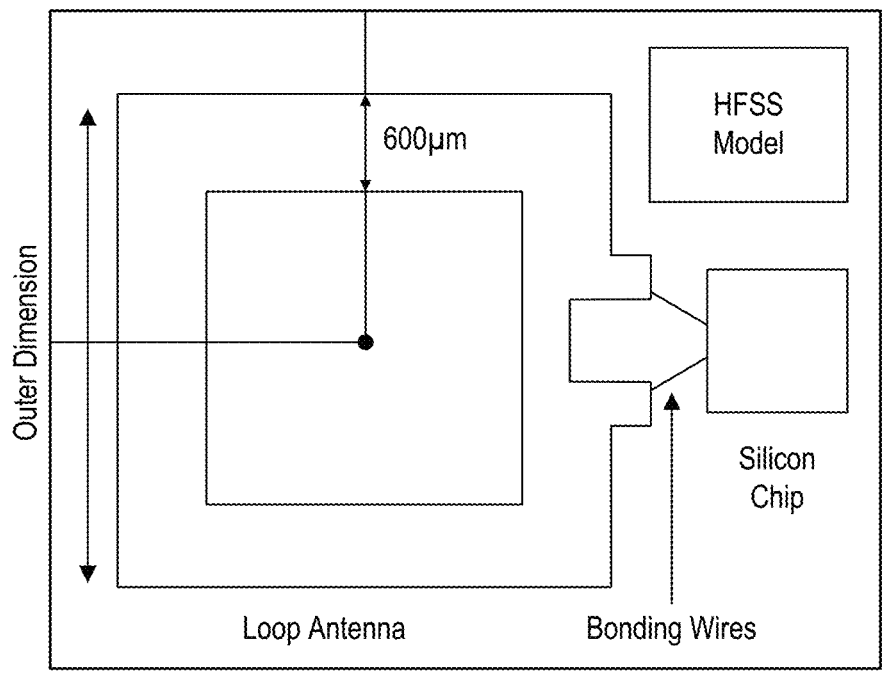
FIGS. 3A and 3B depict the HFSS model and simulation results, respectively, for the antenna.
Figure 3B:
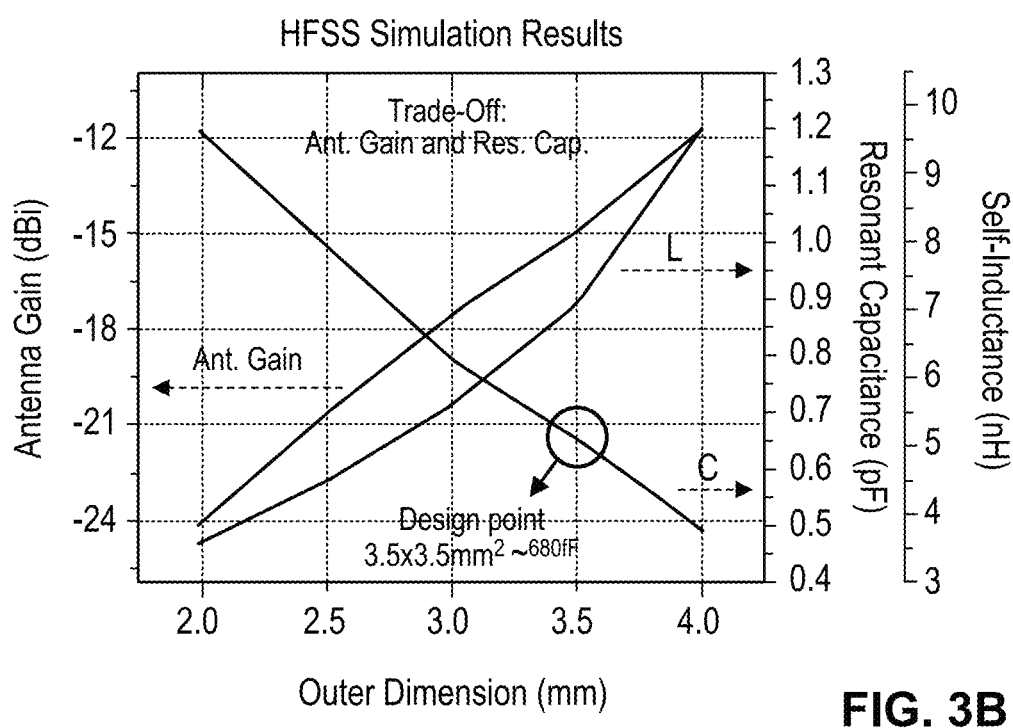

FIG. 2 further depicts an example embodiment of a wireless transmitter 20 with a dual purpose antenna 21. In this example, the loop antenna is implemented off chip and designed with a high quality factor (e.g., greater than 60). More specifically, an electrically-small size (0.028λ) magnetic dipole antenna is chosen because it achieves better efficiency than an electric dipole when considering the Q of on-chip passives for resonating. Thus, a 3.5×3.5 mm² loop antenna was implemented on a Rogers 4003C PCB with −15 dBi omni-directional gain. FIGS. 3A and 3B show the HFSS model and simulation results of the antenna 21 including bonding wires, chip pads and silicon substrate. The simulated capacitance to resonate this antenna at 2.4 GHz is ~680 fF, which is sufficiently large to implement a digitally controlled capacitor array 22 on-chip with practical tuning range and provides margin for parasitic capacitance.

Figure 3C:
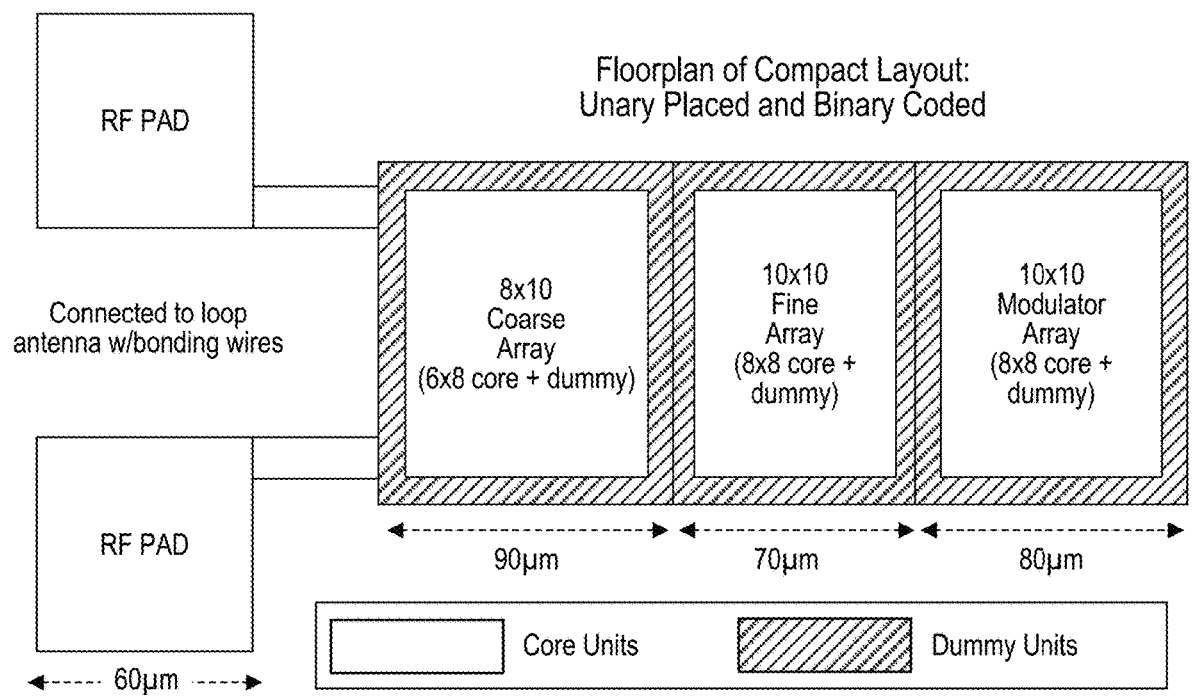
FIG. 3C is a diagram of an example embodiment of the capacitor array.

The LC circuit for the oscillator 23 is comprised of a capacitor array 22 with tunable capacitance and the loop antenna 21 serving as the inductor. The Q-factor of the digitally controlled capacitor array is critical to transmit efficiency, and hence the equivalent series resistance (ESR) of the resonant capacitance must be kept at a minimum. In the example embodiment, the capacitor array exhibits a quality factor greater than one hundred. At the same time, the capacitance resolution and tuning range must meet the BLE standard. An example embodiment for the capacitor array is shown in FIG. 3C. To co-optimize capacitor resolution and Q-factor, a coarse capacitor array 31 is used with 1.02 fF unit cap, achieving ~110 MHz range to cover the BLE bandwidth. Then, a 6b fine capacitor array 32 with 16.8 aF tuning resolution achieves 32.2 KHz resolution for BLE channel selection and another 6b modulator capacitor array 33 has 22.6 KHz resolution for GFSK modulation. Each unit capacitor consists of MOM capacitors (PDK available) and NMOS switches. LVT transistors with a large W/L ratio are used to reduce unit equivalent series resistance. The top two metal layers are 2.5 μm wide to reduce equivalent series resistance overhead and are alternatingly used for adjacent parallel wires to minimize parasitic coupling capacitance.

Figure 4:
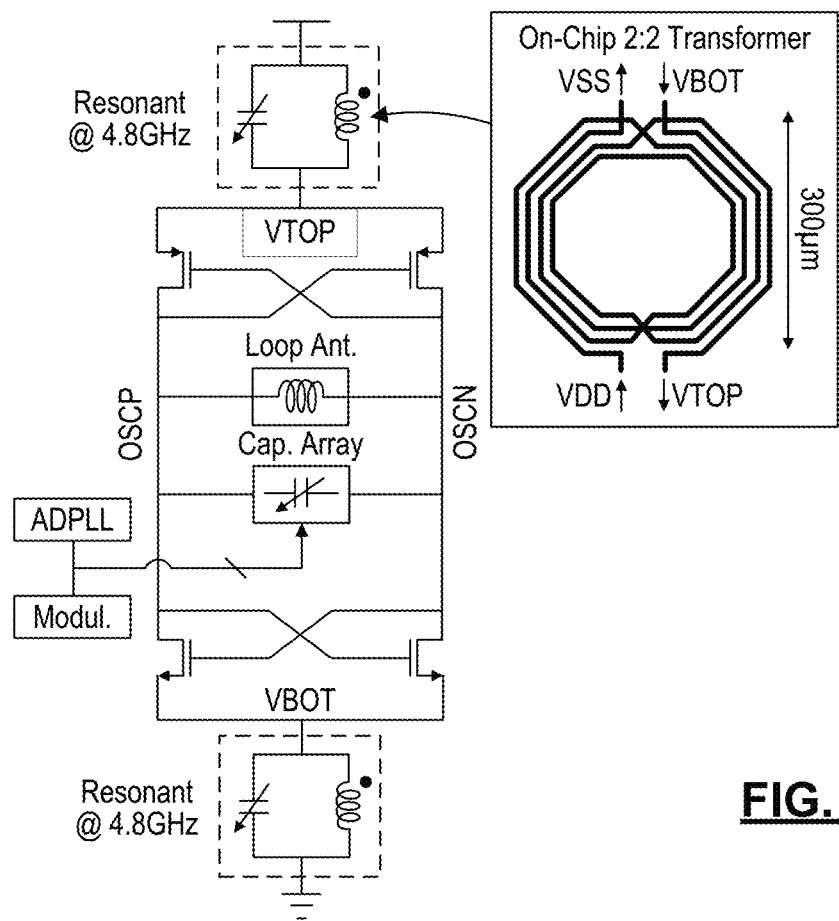
FIG. 4 is a schematic for an example oscillator used in the proposed wireless transmitter.
Figure 5:
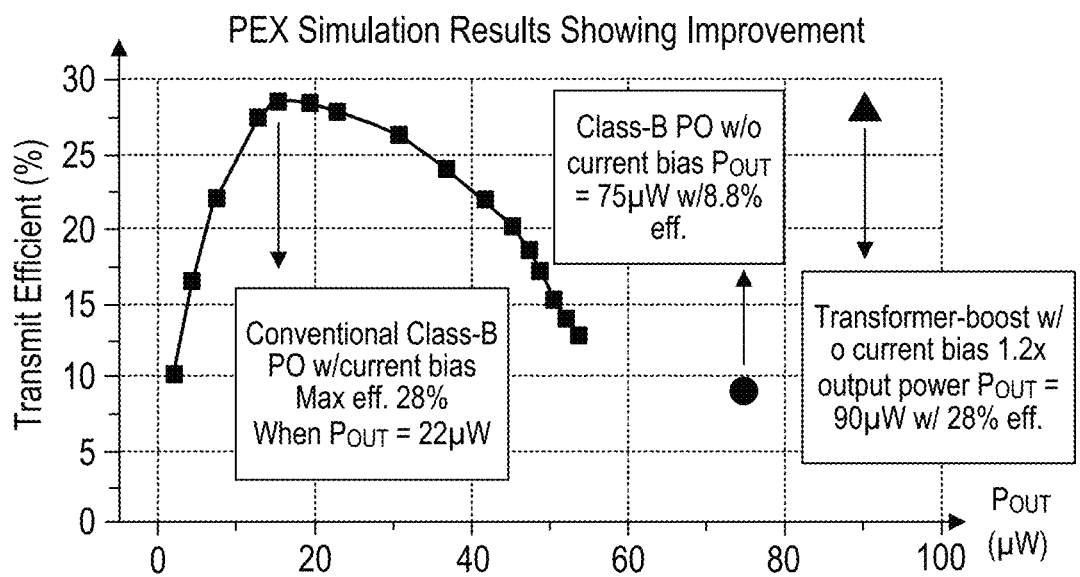
FIG. 5 is a graph showing the simulated transmit efficiency for the transformer boost oscillator.

FIG. 4 is a schematic for a proposed oscillator 40 used in the transmitter 20. The loop antenna 21 and the capacitor array 22 form the LC circuit for the oscillator and may be implemented as described above. The active circuit is formed by two cross-coupled transistor pairs 41, 42. A traditional class-B power oscillator uses a tail current source, similar to a differential LC oscillator. FIG. 5 shows that peak transmit efficiency of 28% is reached when the tail current is tuned to the cross-over between current-limited and voltage-limited regions. However, output power is low, only 22 μW. To increase output power, tail current can be increased, but this causes efficiency to drop dramatically (13% @ 45 μW). Entirely removing the current source results in the maximum power of 75 μW, limited only by supply voltage, but the efficiency is even lower at 8.8%.

Figure 6:
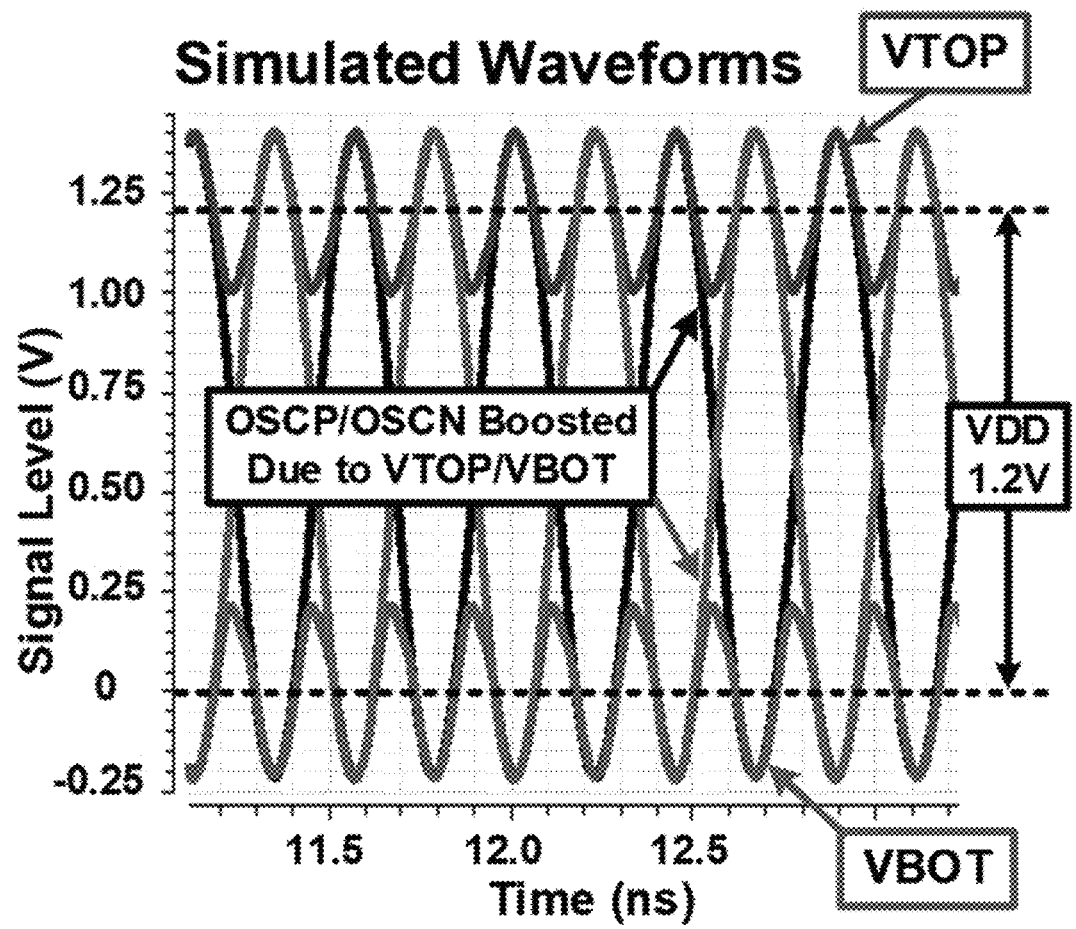
FIG. 6 is a graph showing simulated waveforms for the transformer boost oscillator.

To achieve higher output power and efficiency, the proposed oscillator 40 uses a transformer-boost technique. A transformer replaces the tail current sources on the top and bottom of the cross-coupled transistor pairs 41, 42, forming two resonant tanks with tunable capacitor arrays at 4.8 GHz. That is, the oscillator 40 further includes a first resonator circuit 44 electrically coupled between a supply voltage and the oscillator and a second resonator circuit 46 electrically coupled between the oscillator and electrical ground. The resonant tanks filter out frequency components of current other than 4.8 GHz, which contribute to loss. Through the transformer's magnetic coupling, it also boosts the virtual supply (VTOP and VBOT), increasing oscillation swing by 1.3×, resulting in 90 μW output power with 28% transmit efficiency as seen in FIG. 6. The transformer was implemented on-chip using a top metal layer achieving k=0.75 and Q=12. The measured output power is −8.4 dBm with 27% efficiency due to the degraded Q-factor of the loop antenna.

Returning to FIG. 2, an open-loop GFSK modulator 24 is used for energy saving. When the BLE packet is ready, the ADPLL 23 locks the frequency of the digitally controlled power oscillator 23 (DCPO) within 15 μs. An on-the-fly lock detector 25 monitors the DCPO control word and, upon lock, disables the ADPLL 26 and starts the GFSK modulation of the packet with the DCPO operating in open-loop. The open-loop nature eliminates the need to implement a high-resolution TDC; instead, an injection-locked TDC is implemented based on a 12-phase pseudo differential ring oscillator to avoid DCPO period calibration. The GFSK modulator 24 is implemented as an oversampled (8×) interpolative digital filter where the output frequency during current bit is determined considering both preceding and following bits. The look-up table of the modulator array control word is pre-calibrated for open-loop modulation.

In one implementation, the proposed BLE transmitter 20 is fabricated using 65-nm CMOS on a chip with 0.49 mm² active area. The chip is integrated in a 4.5×18.6 mm² prototype wireless board with custom loop antenna. When operating using a 5.8 mm coin battery, the self-contained transmitter generates −23.4 dBm EIRP, wirelessly measured using a horn antenna (LB-530-NF). The proposed transmitter chip consumes an average power of 606 μW dominated by power oscillator with packet-level duty cycling. The only necessary off-chip component is a 16 MHz crystal oscillator whose power can be as low as 30 μW. It is noted that in this example the largest dimension of the transmitter (including the off chip antenna) is less than five millimeters.

Figure 7:
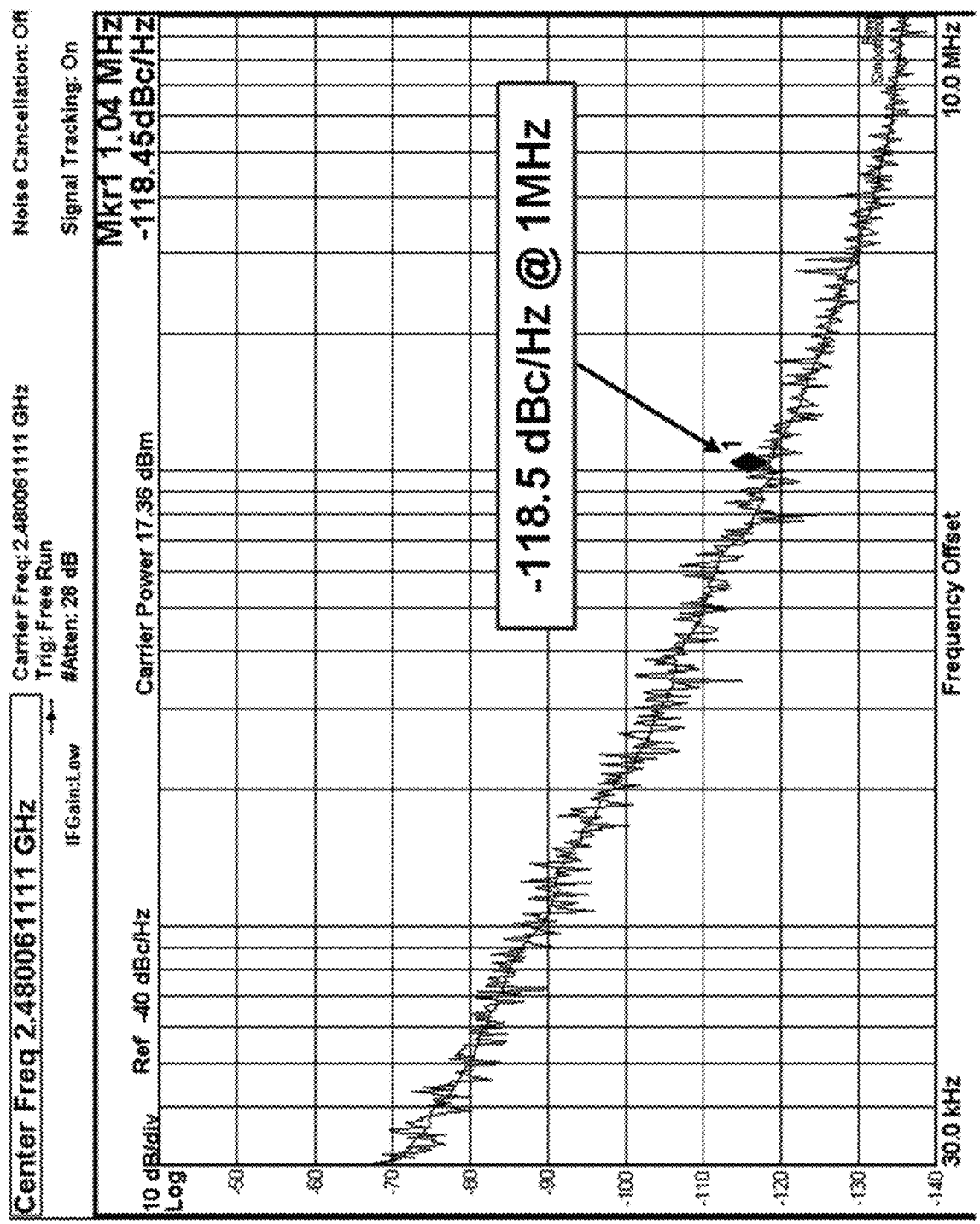
FIG. 7 is a graph showing the measured phase noise of power oscillator.
Figure 8A:
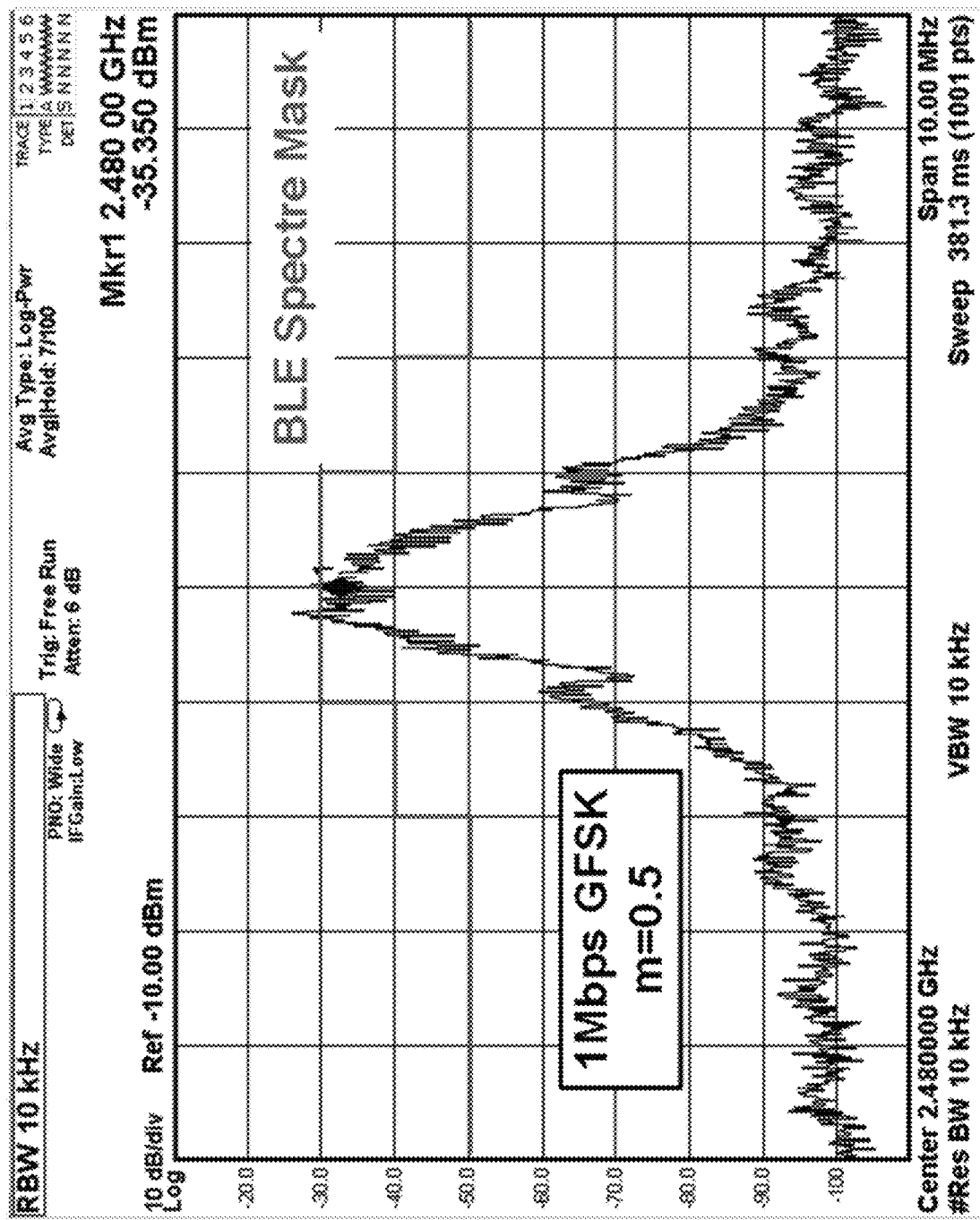
FIGS. 8A-8C are graphs showing the measured results of GFSK spectrum, the deviation frequency and transient of power oscillator frequency, respectively, for the BLE modulation.
Figure 8B:
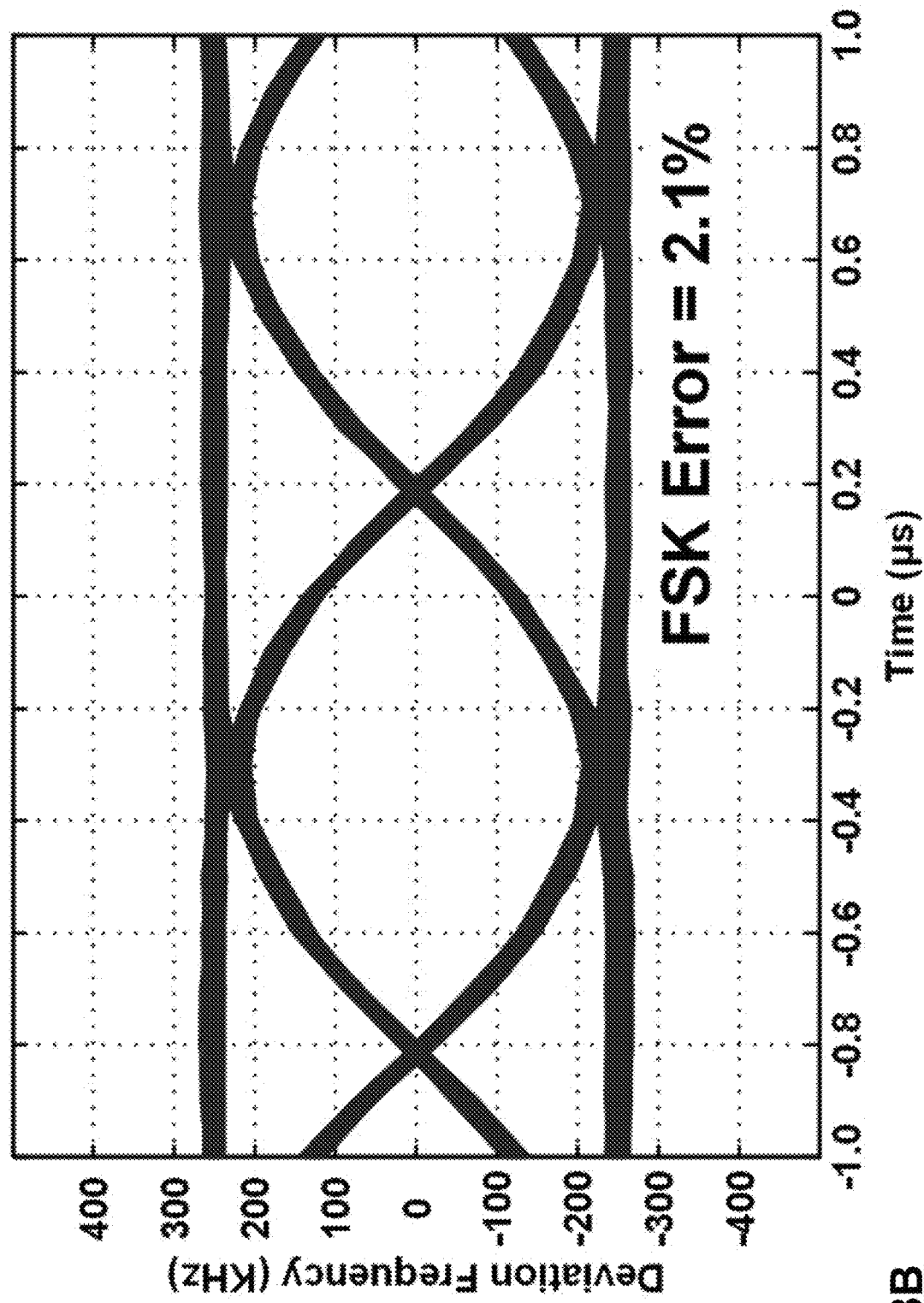
Figure 8C:
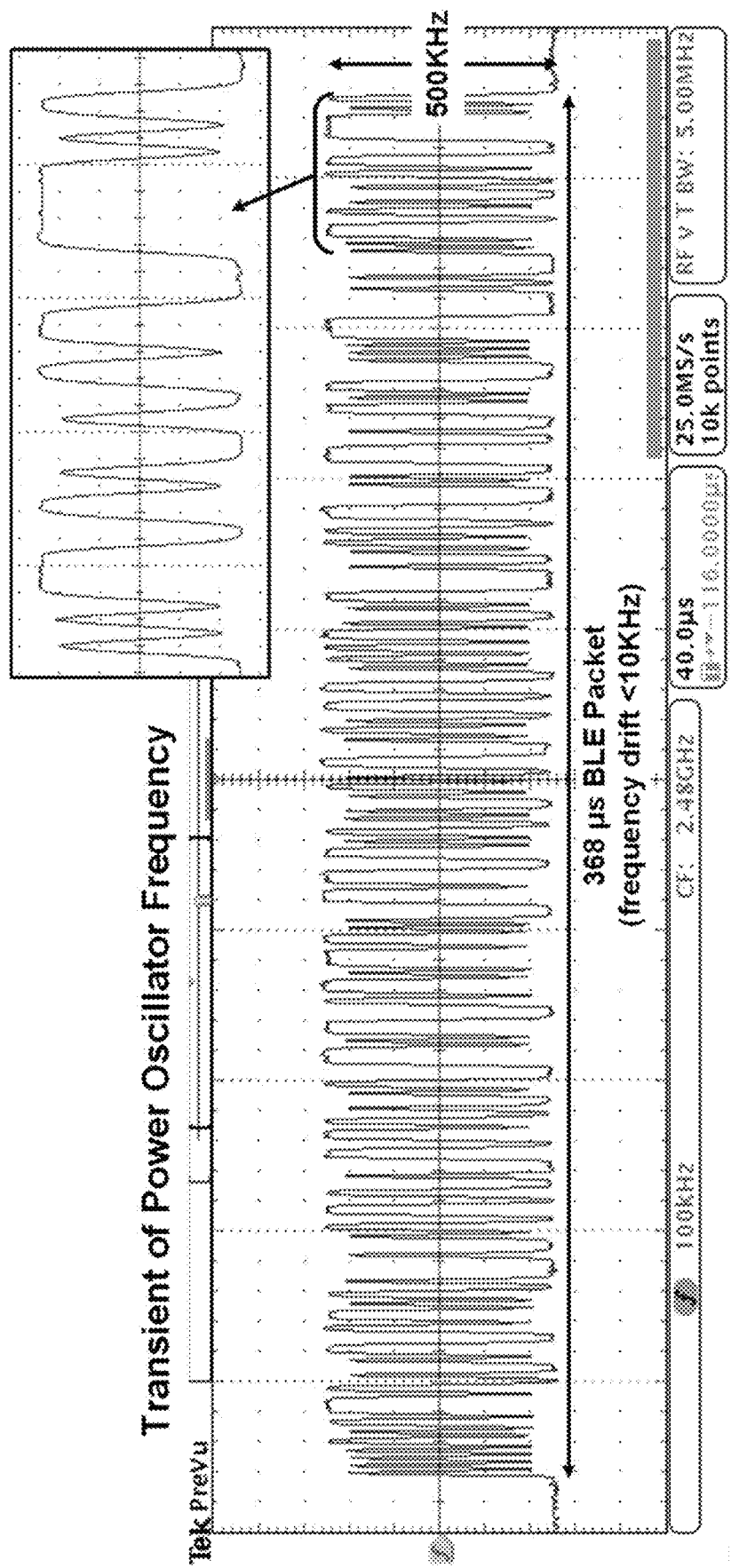

FIG. 7 shows that measured phase noise of power oscillator is −118.5 dBc/Hz at 1 MHz offset consuming 534 μW. Measured relative $2^{nd}$ and $3^{rd}$ harmonic power is −47 dBc and −52 dBc, respectively (both below BLE requirement of −41.5 dBc). FIGS. 8A-8C show measured results of BLE modulation. The BLE spectral mask is met and FSK error is only 2.1%. The measured transient response of the DCPO frequency shows that the frequency drift is below 10 KHz during a 368 μs BLE packet, which is within the BLE specification (<50 KHz).

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A low energy transmitter, comprising:
a loop antenna configured to radiate at a target frequency;
an oscillator that generates a carrier signal and supplies the carrier signal to the loop antenna, where the oscillator includes an LC circuit and the loop antenna acts as an inductor in the LC circuit, wherein the oscillator further includes a first resonator circuit electrically coupled between a supply voltage and the oscillator and a second resonator circuit electrically coupled between the oscillator and electrical ground;
a phase-locked loop circuit interfaced with the oscillator; and
a modulator configured to receive a data packet and operates to modulate at least one of amplitude or frequency of the carrier signal in accordance with the data packet, wherein active components of the oscillator, the phase-locked loop circuit and the modulator are integrated onto a single chip.

2. The low energy transmitter of claim 1 wherein the loop antenna is implemented off the single chip.

3. The low energy transmitter of claim 1 wherein the loop antenna is integrated onto the single chip.

4. The low energy transmitter of claim 1 wherein the loop antenna is primary energy storage element for the oscillator.

5. The low energy transmitter of claim 1 wherein the loop antenna is configured to radiate more than three percent of received signal power.

6. The low energy transmitter of claim 1 wherein the LC circuit of the oscillator includes a capacitor array with tunable capacitance.

7. The low energy transmitter of claim 1 wherein the target frequency is on the order of 2.4 GHz.

8. The low energy transmitter of claim 1 wherein the modulator modulates the carrier signal using frequency-shift keying filters.

9. The low energy transmitter of claim 1 wherein largest dimension is less than five millimeters.

10. A low energy transmitter, comprising:
a loop antenna configured to radiate at a target frequency;
an oscillator that generates a carrier signal and supplies the carrier signal to the loop antenna, wherein the oscillator includes a first resonator circuit electrically coupled between a supply voltage and the oscillator, and a second resonator circuit electrically coupled between the oscillator and electrical ground;
a phase-locked loop circuit interfaced with the oscillator; and
a modulator configured to receive a data packet and operates to modulate at least one of amplitude or frequency of the carrier signal in accordance with the data packet, wherein active components of the oscillator, the digital phase-locked loop circuit and the modulator are integrated onto a single chip.

11. The low energy transmitter of claim 10 wherein the first resonator circuit is magnetically coupled to the second resonator circuit.

12. The low energy transmitter of claim 10 wherein the loop antenna is implemented off the single chip.

13. The low energy transmitter of claim 10 wherein the loop antenna is primary energy storage element for the oscillator.

14. The low energy transmitter of claim 10 wherein the loop antenna is configured to radiate more than three percent of received signal power.

15. The low energy transmitter of claim 10 wherein the LC circuit of the oscillator includes a capacitor array with tunable capacitance.

16. The low energy transmitter of claim 10 wherein the target frequency is on the order of 2.4 GHz.

17. The low energy transmitter of claim 10 wherein the modulator modulates the carrier signal using frequency-shift keying filters.

18. The low energy transmitter of claim 10 wherein largest dimension is less than five millimeters.

* * * * *